United States Patent [19]

Mouissie

[11] 3,850,491

[45] Nov. 26, 1974

[54] CIRCUIT BOARD SOCKET

[75] Inventor: Bob Mouissie, Berlicum, Netherlands

[73] Assignee: E. I. du Pont de Nemours and Company, Wilmington, Del.

[22] Filed: Apr. 19, 1973

[21] Appl. No.: 352,522

[30] Foreign Application Priority Data

Feb. 12, 1973 Netherlands.................. 7301938

[52] U.S. Cl............ 339/17 C, 174/68.5, 339/275 B

[51] Int. Cl............................ H05k 1/02, H05k 1/08

[58] Field of Search............ 339/17, 18, 64, 63, 59, 339/61, 176, 275 B, 174, 252, 256, 258, 259, 255, 95, 183, 217, 220; 174/68.5

[56] References Cited

UNITED STATES PATENTS

| | | | |
|---|---|---|---|
| 3,114,586 | 12/1963 | Albert | 339/17 C |
| 3,288,915 | 11/1966 | Hatfield et al. | 339/276 R X |
| 3,536,869 | 10/1970 | Renshaw, Jr. | 339/183 X |
| 3,573,707 | 4/1971 | Reynolds | 339/17 |
| 3,601,662 | 8/1971 | de Borros | 339/17 C X |
| 3,654,583 | 4/1972 | Moncici | 339/17 C |
| 3,681,738 | 8/1972 | Friend | 339/17 R |

*Primary Examiner*—Paul R. Gilliam
*Assistant Examiner*—Terrell P. Lewis
*Attorney, Agent, or Firm*—Thomas Hooker

[57] ABSTRACT

An improved circuit board socket with a contact spring fitted within an open ended cylindrical plastic body with legs extending outwardly of the body for forming a solder connection with the sides of a circuit board hole. The plastic body prevents solder from flooding the contact spring within the body.

2 Claims, 4 Drawing Figures

CIRCUIT BOARD SOCKET

The invention relates to a circuit board socket of the type disclosed in U.S. Pat. Nos. 3,681,738 and 3,681,744. These patents disclose sockets which are soldered in circuit board holes. Leads may be inserted into the socket bodies for establishing an electrical connection with a spring contact confined therein. The spring contact is in electrical connection with printed circuitry on the board. The conventional socket uses a drawn metal body closed at one end in order to assure that the solder does not flow into the spring contact during the soldering operation by which the socket is secured to the circuit board.

The invention relates to an improved circuit board socket of the type previously described in which the socket body is formed of a cylinder of heat resistant plastic or other similar material. Both ends of the body are open. The spring is fitted into one end of the body and includes a spring contact within the body for electrical engagement with a lead inserted into the body and legs extending outwardly of the body for forming a solder connection with the circuit board. During the soldering operation molten solder does not adhere to or flow along the plastic body and thus does not come into contact with the spring contact in the body. The legs extend outwardly of the body and are soldered in the circuit board hole thus forming a physical and electrical connection with a circuit board.

Other objects and features of the invention will become apparent as the description proceeds, especially when taken in conjunction with the accompanying drawings, of which there is one sheet.

IN THE DRAWINGS

Figures 1, 2:
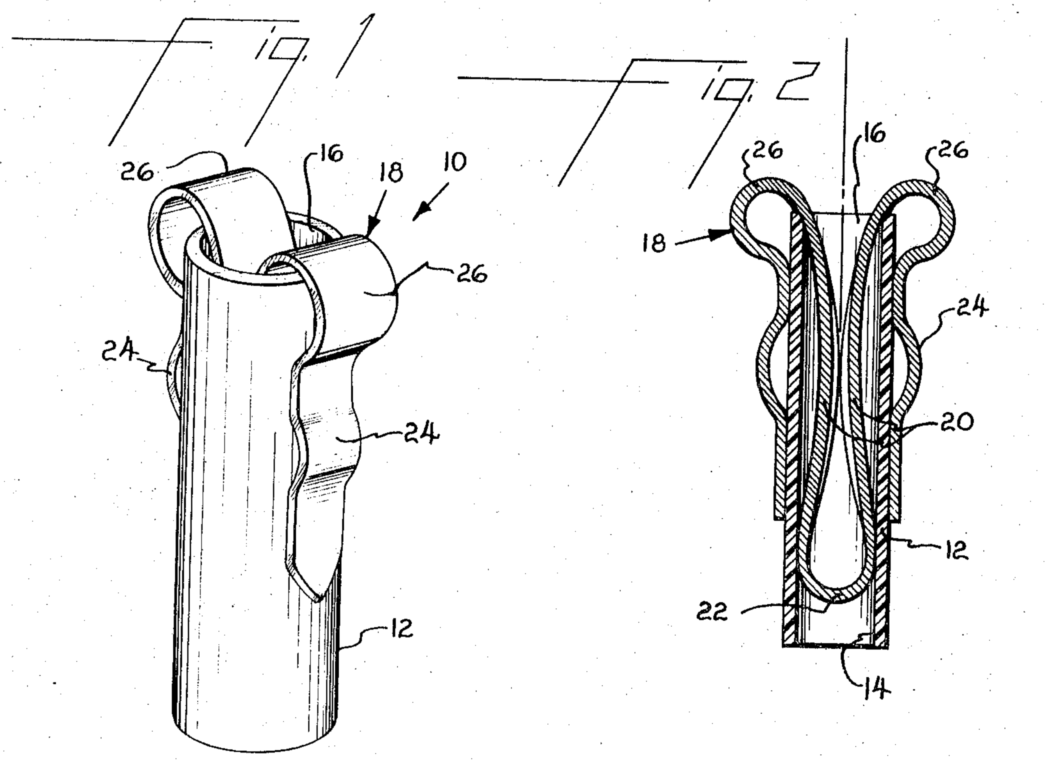
FIG. 1 is a perspective view of a circuit board socket according to the invention.
FIG. 2 is a sectional view taken through the socket of FIG. 1.

Circuit board socket 10 includes a cylindrical plastic body 12 having openings 14 and 16 at the opposite end thereof. The body 12 may be formed of a Polytetrafluorethylene plastic or other material to which solder does not adhere.

An M-shaped spring contact 18, of the type disclosed in U.S. Pat. No. 3,681,738, is fitted to the body 12 through opening 16. Spring contact 18 includes a pair of contact arms 20 fitted within the interior of body 12 and joined together by a bight portion 22. Solder legs 24 extend along the outside of the body 12 adjacent opening 16 and are joined to the contact arms 20 by spring curls 26 which extend around opposite sides of end 16. The arms 20 and legs 24 connected by bight 22 and curls 26 are arranged generally in the shape of an M.

Figure 3:
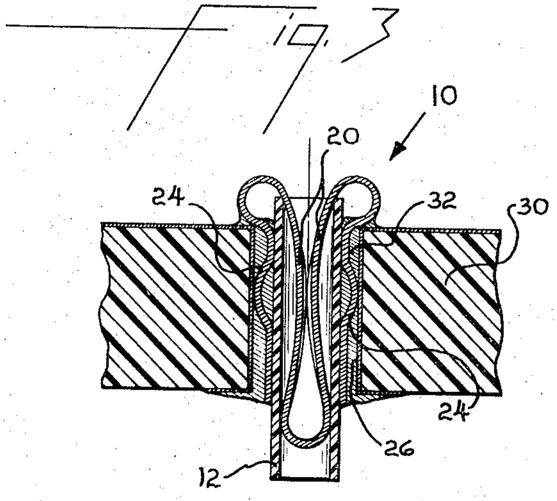
FIGS. 3 and 4 are sectional views illustrating the socket soldered in place within a circuit board hole.

Socket 10 may be fitted in a circuit board hole 28 as illustrated in FIG. 3 with legs 24 engaging the interior of the hole to retain the socket in place prior to the soldering operation. Circuit board hole 28 is plated and extends through the thickness of circuit board 30. After positioning of the socket in the hole the socket is soldered in place, conventionally by a wave soldering operation. The molten solder flows up into the circuit board hole 26 around body 12 to form a soldered connection 32 between solder legs 24 and the printed circuitry in hole 26. Because solder does not adhere to the surfaces of the cylindrical socket body 12, molten solder does not flow into the interior of the body. In this way the contact arms 20 are maintained free of solder during the soldering operation despite the fact that the portion of the socket 10 extending below board 30 may be completely immersed in molten solder.

Figure 4:
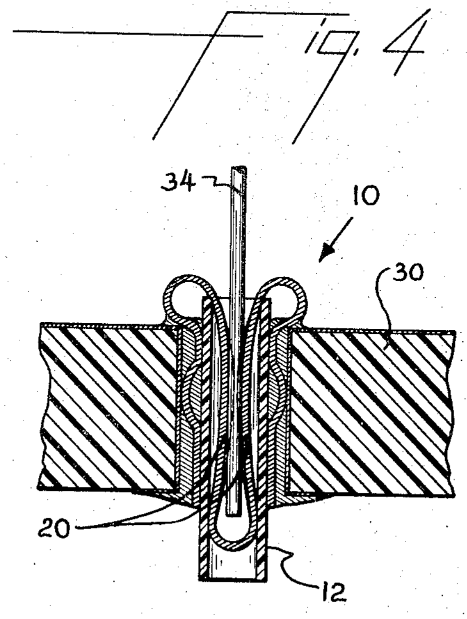

FIG. 4 illustrates a socket 10 soldered to printed circuitry on circuit board 30 with a lead 34 inserted through end 16 and between contact arms 20. Insertion of the lead forces the arms apart a slight distance to form a desired pressure connection between the lead and the arms 20. Legs 24 are soldered to the circuitry on board 30 thus assuring that an electrical connection is formed between the lead 34 and the circuitry on the board.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. In a circuit board socket of the type having a metal spring and solder contact, the improvement comprising a general cylindrical body open at both ends and formed of a material to which solder does not adhere, with the contact fitted over one edge of the body at one end with spring contact within the body and the solder contact extending along an exterior surface of the body away from such end.

2. A circuit board socket as in claim 1 wherein the body is formed of a Polytetrafluorethylene plastic.

* * * * *